United States Patent
Jeng et al.

(10) Patent No.: US 7,365,026 B2
(45) Date of Patent: Apr. 29, 2008

(54) $C_xH_y$ SACRIFICIAL LAYER FOR CU/LOW-K INTERCONNECTS

(75) Inventors: Shwang-Ming Jeng, Hsin-Chu (TW); Ming Ling Yeh, Tainan (TW); Tien-I Bao, Hsin-Chu (TW); Keng-Chu Lin, Ping-Tung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 338 days.

(21) Appl. No.: 11/048,215

(22) Filed: Feb. 1, 2005

(65) Prior Publication Data

US 2006/0172530 A1   Aug. 3, 2006

(51) Int. Cl.
*H01L 21/469* (2006.01)
*H01L 23/58* (2006.01)

(52) U.S. Cl. ............................ 438/780; 257/642

(58) Field of Classification Search ........ 438/623–624, 438/637, 639, 780, 790; 257/642, E21.576, 257/E21.584
See application file for complete search history.

(56) References Cited

U.S. PATENT DOCUMENTS

| | | | |
|---|---|---|---|
| 5,691,009 A * | 11/1997 | Sandhu | 427/534 |
| 6,159,786 A | 12/2000 | Chiang et al. | |
| 6,248,665 B1 | 6/2001 | Bao et al. | |
| 6,271,123 B1 | 8/2001 | Jang et al. | |
| 6,383,935 B1 | 5/2002 | Lin et al. | |
| 6,424,044 B1 | 7/2002 | Han et al. | |
| 6,514,855 B1 * | 2/2003 | Suzuki et al. | 438/637 |
| 6,541,842 B2 | 4/2003 | Meynen et al. | |
| 6,607,977 B1 | 8/2003 | Rozbicki et al. | |
| 6,616,855 B1 | 9/2003 | Chen et al. | |
| 6,624,066 B2 | 9/2003 | Lu et al. | |
| 6,723,635 B1 | 4/2004 | Ngo et al. | |
| 6,878,615 B2 | 4/2005 | Tsai et al. | |
| 6,905,958 B2 | 6/2005 | Gracias et al. | |
| 7,015,136 B2 * | 3/2006 | Bao et al. | 438/638 |
| 2004/0018452 A1 | 1/2004 | Schilling | |
| 2004/0099952 A1 | 5/2004 | Goodner et al. | |
| 2004/0121583 A1 | 6/2004 | Bao et al. | |
| 2004/0121586 A1 | 6/2004 | Abell | |
| 2004/0156987 A1 | 8/2004 | Yim et al. | |
| 2005/0148202 A1 | 7/2005 | Heiliger et al. | |
| 2005/0245071 A1 | 11/2005 | Wu et al. | |
| 2006/0027929 A1 | 2/2006 | Cooney, III et al. | |
| 2006/0027930 A1 | 2/2006 | Edelstein et al. | |

* cited by examiner

*Primary Examiner*—Calvin Lee
(74) *Attorney, Agent, or Firm*—Slater & Matsil, L.L.P.

(57) ABSTRACT

A semiconductor method of manufacturing involving low-k dielectrics is provided. The method includes depositing a hydrocarbon of the general composition $C_xH_y$ on the surface of a low-k dielectric. The hydrocarbon layer is deposited by reacting a precursor material, preferably $C_2H_4$ or $(CH_3)_2CHC_6H_6CH_3$, using a PECVD process. In accordance with embodiments of this invention, carbon diffuses into the low-k dielectric, thereby reducing low-k dielectric damage caused by plasma processing or etching. Other embodiments comprise a semiconductor device having a low-k dielectric, wherein the low-k dielectric has carbon-adjusted dielectric region adjacent a trench sidewall and a bulk dielectric region. In preferred embodiments, the carbon-adjusted dielectric region has a carbon concentration not more than about 5% less than in the bulk dielectric region.

18 Claims, 3 Drawing Sheets

$C_XH_Y$ SACRIFICIAL LAYER FOR CU/LOW-K INTERCONNECTS

CROSS-REFERENCE TO RELATED APPLICATIONS

This application related to co-pending and commonly assigned patent application Ser. No. 11/048,518 (TSM04-08 16), filed concurrently herewith, entitled "Sealing Pores of Low-K Dielectrics Using CxHy." This application also relates to co-pending and commonly assigned patent application Ser. No. 10/985,149 (TSM04-0369), filed Nov. 10, 2004, entitled "Diffusion Barrier for Damascene Structures." These co-pending and commonly assigned patent applications are hereby incorporated by reference.

TECHNICAL FIELD

This invention relates to semiconductor manufacture and more particularly to improved methods for forming devices having low-k dielectrics.

BACKGROUND

As the density of semiconductor devices increases and the size of circuit elements becomes smaller, the resistance capacitance (RC) delay time increasingly dominates the circuit performance. To reduce the RC delay, there is a desire to switch from conventional dielectrics to low-k dielectrics. These materials are particularly useful as intermetal dielectrics, IMDs, and as interlayer dielectrics, ILDs. However, low-k materials present problems during processing, especially during the processing of the conductive material used to make interconnects.

The conductive material is typically patterned and etched using high-energy plasma etch processes. In other process schemes, the low-k material is patterned through the application and patterning of photoresist. The low-k material is etched through the photoresist mask, and then the photoresist is removed with a high energy plasma etch process. The low-k materials are susceptible to damage from a plasma etch because they are softer, less chemically stable or more porous, or any combination of these factors. The plasma damage can manifest itself in higher leakage currents, lower breakdown voltages, and changes in the dielectric constant associated with the low-k dielectric material.

FIG. 1 shows a schematic representation of a cross-section of a damascene structure. Dielectric layer 12 has been laid down over wiring level 11. Extending downwards from the trench 15 is a via hole 14. When the structure has been filled with copper, via 14 provides a connection between the two wiring levels. Because of its high diffusivity and its tendency to act as a recombination center in silicon, steps must be taken to ensure that all the copper is confined to the damascene structure. This is conventionally accomplished with a barrier layer 18 that lines the walls of the trench 15 and via hole 14, as illustrated in FIG. 2.

During processing, low-k dielectric surfaces are susceptible to damage. Porous low-k dielectrics, such as porous silica, are particularly susceptible. When surface pores are damaged, processing chemicals may penetrate into the dielectric and raise its dielectric constant. Low-k dielectric damage causes surface roughness of the trench floor 21 and trench wall 23, as shown in FIGS. 1 and 2. This, in turn, means that a much thicker barrier layer 18, FIG. 2, than normal is needed ensure that there are no thin patches through which copper could move. In the absence of the afore-mentioned roughness problem, a barrier layer about 300 Angstroms thick is sufficient to contain the copper whereas, in the presence of a rough trench surface, this has to be increased to at least 500 Angstroms.

As noted above, dielectric damage causes higher leakage currents, lower breakdown voltages, and changes in the dielectric constant associated with the low-k dielectric material. In view of these and other problems, there is a need for improved low-k dielectric manufacturing methods.

SUMMARY OF THE INVENTION

These and other problems are generally solved or circumvented and technical advantages are generally achieved by preferred embodiments of the present invention that provide an improved method of forming semiconductor devices having low-k dielectric.

A preferred embodiment provides a method for forming a semiconductor device having a low-k dielectric. A hydrocarbon layer is deposited on the low-k dielectric. In preferred embodiments, the hydrocarbon layer is deposited using PECVD using a $(CH_3)_2CHC_6H_6CH_3$ or $C_2H_4$ precursor. Embodiments further comprise forming a recessed feature in the hydrocarbon layer and in the low-k dielectric using a plasma etch. In accordance with embodiments of this invention, carbon diffuses into the low-k dielectric, thereby reducing low-k dielectric damage caused by plasma processing.

Another embodiment provides a method for repairing carbon depletion damage of a low-k dielectric caused by a semiconductor manufacturing process. The method comprises depositing a hydrocarbon layer on the low-k dielectric by reacting a precursor material using a PECVD reaction process. In preferred embodiments, the hydrocarbon layer comprises between about 20 and 95 atomic percent of C; between about 5 and 80 atomic percent of H; and between about 0 and 5 atomic percent of O.

Still other embodiments comprise a semiconductor device having a low-k dielectric, wherein the low-k dielectric has a carbon-adjusted region near a trench sidewall. In preferred embodiments, the carbon-adjusted region has a carbon concentration not more than about 5% less than in a bulk dielectric region.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The operation and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

This invention relates generally to semiconductor device manufacturing and more particularly to the formation and processing of porous, low-k dielectrics. The low-k dielectrics may include films or layers, but embodiments are not limited to these morphologies. The present invention will now be described with respect to preferred embodiments in a specific context, namely the creation of copper conductive lines and vias in the damascene process. It is believed that embodiments of this invention are particularly advantageous when used in this process. It is further believed that embodiments of this invention are advantageous when used in other semiconductor fabrication applications wherein low-k dielectric performance is a concern. It is further believed that embodiments described herein will benefit other integrated circuit interconnection applications not specifically mentioned. Therefore, the specific embodiments discussed are merely illustrative of specific ways to make and use the invention, and do not limit the scope of the invention.

Figure 1:
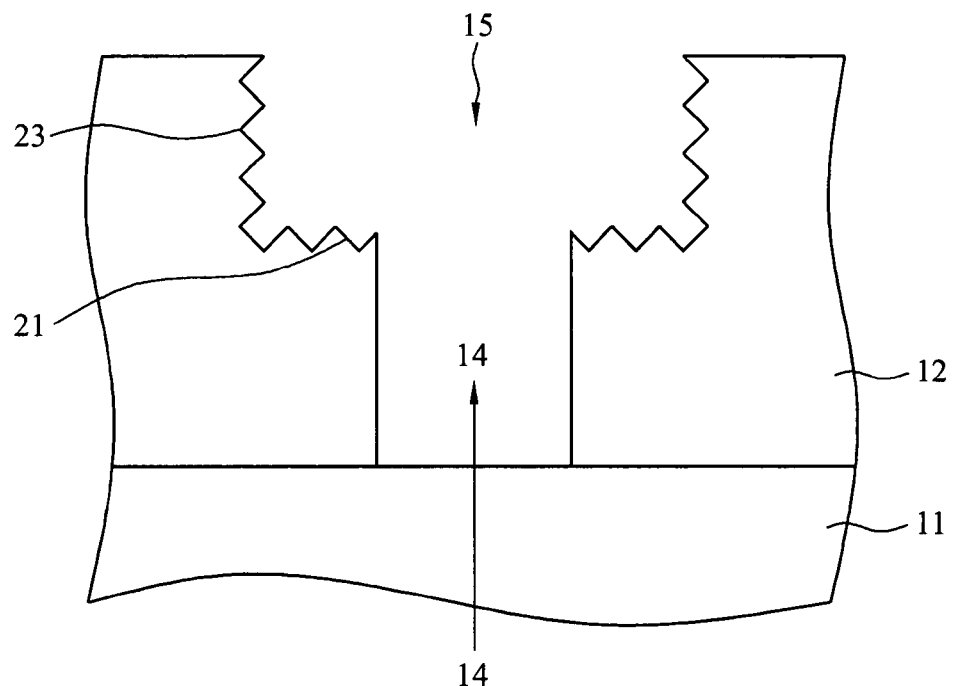
FIGS. 1 and 2 are cross sectional views of a semiconductor device at an intermediate step in a conventional damascene process illustrating low-k dielectric surface roughness damage.
Figure 2:
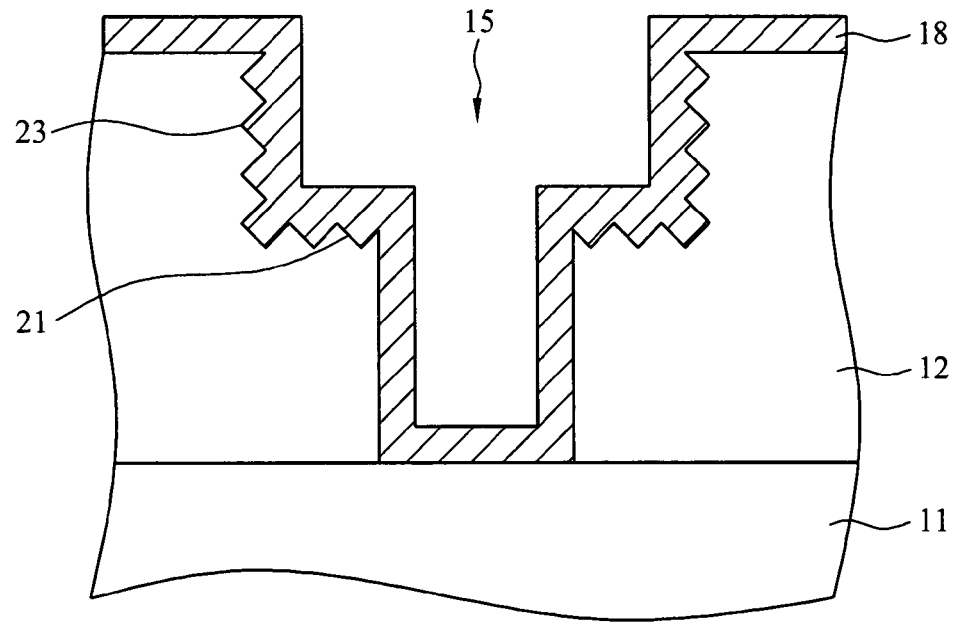
Figure 3:
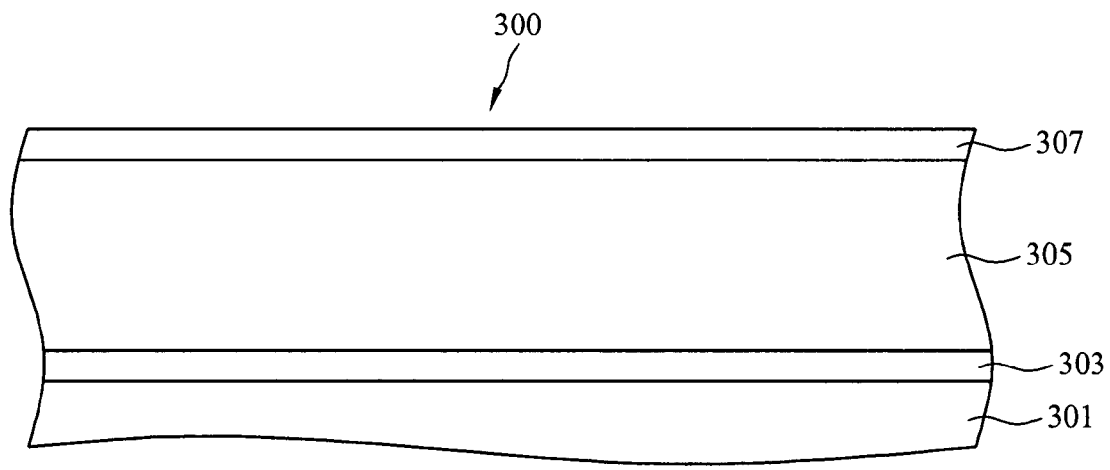
FIG. 3 is a cross sectional view of a semiconductor device at an intermediate step in an exemplary damascene process further illustrating a $C_xH_y$ layer according to preferred embodiments.

Referring now to FIG. 3, there is shown a cross section of the representative intermediate damascene structure 300 to be treated in accordance with an exemplary damascene process and embodiments of the invention. Shown in FIG. 3 is a semiconductor substrate 301 that may comprise, for example, silicon, SOI, functional and logical devices, other interconnected layers, or it may comprise a combination thereof. For the purpose of describing embodiments of the invention below, the substrate 301 comprises an ILD and a conductive interconnect. The details of the damascene process are described by Bao et al. in U.S. Pat. No. 6,248,665 and in U.S. Patent Application Publication 2004/0121583, both of which are hereby incorporated by reference.

Still referring to FIG. 3, over the substrate 301 is a first etch stop layer 303. Overlying the first etch stop layer 303 is a low-k dielectric 305, also referred to as an inter-metal dielectric (IMD), an interlevel dielectric layer (ILD), or a dielectric layer.

In accordance with preferred embodiments, a hydrocarbon layer 307, comprising $C_xH_y$ is preferably deposited using plasma enhanced chemical vapor deposition (PECVD), although other plasma processes or film deposition methods are suitable. Hydrocarbon layer 307 is formed in the PECVD reactor from an organic molecule precursor. Suitable precursors include hydrocarbons having sufficient volatility so that they form a vapor in the reaction vessel. A preferred precursor is a substituted hexane derivative α-terpinene (ATRP), $(CH_3)_2CHC_6H_6CH_3$ or ethylene, $C_2H_4$. Alternative precursors include any other hydrocarbon, preferably those having a carbon-carbon double bond. By controlling such PECVD parameters as temperature, pressure, RF power, gas flow rates, the hydrocarbon precursor suitably deposits. Typically hydrocarbon layer 307 is about 40 to 50 Å when the trench depth is about 2000 Å.

The PECVD process preferably includes an inert carrier gas, such as He. The amount of He may be from about 25 sccm to about 10,000 sccm, and preferably from about 50 sccm to about 5000 sccm. The substrate temperature is between about 25° C. and about 400° C., and preferably between about 125° C. and about 350° C. A RF power density between about 50 W and about 2500 W, and preferably between about 50 W and about 1500 W is utilized. Reactor pressure during the deposition process between about 100 mTorr and about 10000 mTorr, and preferably between about 500 mTorr and about 8000 mTorr is utilized. A suitable hydrocarbon layer 307 deposits in about 10 seconds.

The hydrocarbon layer 307 preferably comprises: between about 20 and about 95 atomic percent of C; between about 0 and about 5 atomic percent of O; and between about 5 and about 80 atomic percent of H. The main process variables controlled during a deposition process for a film are the RF power, the flow rates of the precursors, the reactor pressure and the substrate temperature.

Figure 4:
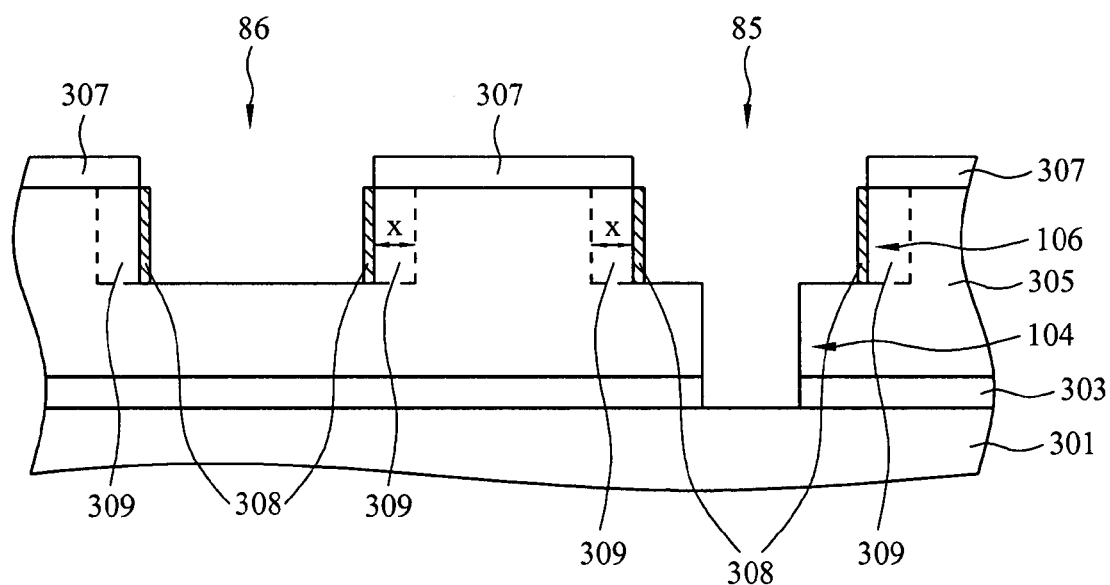
FIG. 4 is a cross sectional view of an intermediate step in an exemplary damascene process further illustrating a carbon-adjusted region near a trench sidewall according to preferred embodiments.

Referring to FIG. 4, there is shown a cross sectional, side view of the intermediate semiconductor device of FIG. 3 further including an anisotropically etched, intermediate, dual damascene structure 85. Within the intermediate damascene structure 85 is a recessed feature comprised of a via 104 and an overlying trench 106.

The dual damascene structure 85 is formed by first sequentially photolithographically patterning and anisotropically etching the via 104, through the low-k dielectric 305, and at least partially through the first etch stop layer 303. This is followed by a similar process to photolithographically pattern and anisotropically etch a trench 106 through the first etch stop layer 303 and a portion of the low-k dielectric 305. These steps form a trench 106 overlying and encompassing the via 104. It will be appreciated that the trench 106 may encompass one or more vias 104 and that the trench 106 and via 104 may be formed in separate stacked IMD layers including another etch stop layer formed between the respective IMD layers. It is to be further appreciated that the surface of the low-k dielectric 305 may include other recessed features such as a trench 86 to contain additional interlevel conductors.

As described above with respect to conventional low-k dielectric processing, the trench etching process damages trench sidewalls. Embodiments of the present invention avoid this problem, however. This is because during trench etching, carbon transfers from hydrocarbon layer 307 to the sidewalls of the trenches 86 and 106 and the via 104, thereby forming a carbon coating 308. As used herein, carbon coating includes a broader class of materials than just pure carbon.

The carbon coating 308 may comprise a hydrocarbon, a carbon-containing organic material, a material comprising carbon, hydrogen and oxygen, or a mixture of carbon materials. Applicants hypothesize that the carbon transfer process occurs via a polymerization reaction process. Accordingly, Applicants propose that the carbon coating 308 may comprise, in part, a polymer layer. Generally, in embodiments of the invention, the carbon coating 308 comprises a carbon source wherefrom carbon may diffuse into an adjacent dielectric region.

After deposition of the carbon coating 308 on the trench sidewalls, carbon diffuses from the carbon coating 308 into the low-k dielectric 305. This diffusion process forms a carbon-adjusted region 309, x thick, adjacent the trench sidewalls of the low-k dielectric 305. Preferably, x is about 300 to 500 Å. In accordance with embodiments of the invention, the carbon-adjusted region 309 partially repairs carbon depletion damage caused by conventional trench etching or plasma processing.

In conventional trench formation within carbon-containing low-k dielectrics, the carbon is usually depleted adjacent the trench sidewalls. Usually the depletion is significant. Typically, the carbon level adjacent the trench sidewalls is reduced at least 5% to 10% relative to the bulk dielectric carbon concentration.

Embodiments for repairing carbon depletion are not limited to the illustrative embodiments comprising a trench sidewall. Generally, plasma processing depletes carbon from a dielectric surface region. Preferred embodiments restore the surface carbon level to at least 95% its initial value.

The carbon-adjusted region 309 may also be referred to as a carbon enriched region for alternative embodiments wherein the carbon level adjacent the trench sidewall is raised above the bulk dielectric carbon level. However, Applicants find that preferred embodiments do not require carbon enrichment of the dielectric as restricting carbon depletion to no more than 5% is believed sufficient to achieve suitable dielectric performance.

As described above, one type of low-k dielectric damage in a conventional process is the roughening a low-k dielectric surface. Applicants find that a conventionally processed dielectric has an average surface roughness value of 34.7 Å, an RMS surface roughness value of 44.16 Å, and a maximum surface roughness value of 447.88 Å. However, in accordance with preferred embodiments, Applicants find that the dielectric has an average surface roughness value of 11.1 Å, an RMS surface roughness value of 14.2 Å, and a maximum surface roughness value of 314.8 Å. As a result of the decreased surface damage, Applicants find that the RC value of a test device decreases 10%.

After repairing carbon depletion damage caused by trench formation, the remaining $C_xH_y$ layer 307, carbon coating 308, or, generally, any carbon residue is removed using a heat treatment at about 300 to 400° C. Generally, this heat treatment is easily integrated into another process.

Continuing with FIG. 4, the low-k dielectric 305 includes dielectrics with k less than about 4. Such dielectrics include, for example, a carbon doped silicon dioxide, also referred to as organosilicate glass (OSG) and C-oxide. In alternative embodiments, low-k materials may include borophosphosilicate glass (BPSG), borosilicate glass (BSG), phosphosilicate glass (PSG), deposited over the surface of the semiconductor structures to a thickness of between about 5000 to 9000 Angstroms and preferably planarized. Exemplary organic low-k materials include polyarylene ether, hydrogen silesquioxane (HSQ), methyl silsesquioxane (MSQ), polysilsequioxane, polyimide, benzocyclbbutene, and amorphous polytetrafluoroethylene (PTFE, which is frequently referred to as Teflon®). Other types of low-k materials suitably used with the method of the present invention include fluorinated silicate glass (FSG) such as fluorine-doped —(O—Si$(CH_3)_2$—O)—.

The low-k dielectric 305 may also include a class of low-k dielectrics frequently called extreme low-k (ELK) dielectrics. ELK dielectrics typically have a dielectric constant less than about 2, and they include porous dielectrics. Suitable ELK dielectric materials may include SiN, SiO, spun-on-glass (SOG), plasma enhanced (PE) tetraethoxysilane (TEOS), halogenated SiO, and fluorinated silicate glass.

Other preferred ELK dielectrics include a class of dielectrics that contain an unreacted, pore-generating material, or porogen. Heating the porogen above its decomposition temperature generates pores in the dielectric. By way of example, Dow Chemical's porous SILK product and JSR Corporation's JSR 5109 are suitable, commercially available low-k precursors that utilize an organic host material. In preferred embodiments, the low-k dielectric comprises Shipley's commercially available ZIRKON™ LK ILD. ZIRKON™ LK ILD is a blend of a methylsilsesquioxane (MSQ) based material with acrylic, polymer-based, nano-particle porogen dispersed in a solvent (PGMEA). An alternative preferred ELK includes PECVD $Si_wO_xC_yH_z$ because it has the potential to achieve k<2 either with or without a porogen.

ZIRKON™ LK ILD is preferably deposited using a conventional spin coater. After depositing, it is partially cured, preferably in a vertical furnace between about 250 and 300° C. in order to cross-link the matrix. Degradation of the ZIRKON™ LK ILD porogen begins at about 275° C., and complete degradation occurs at about 450° C.

Open pores in porous low-k materials are known to degrade performance. Therefore embodiments may optionally include a pore-sealing method such as plasma pore sealing using Ar and $NH_3$, metal organic pore sealing, vapor pore sealing, or preferably e-beam pore sealing. The e-beam pore sealing employs an electron beam with a typical condition of 2000~5000 keV, 1~6 mA, and 75~100 µC/cm².

Figure 5:
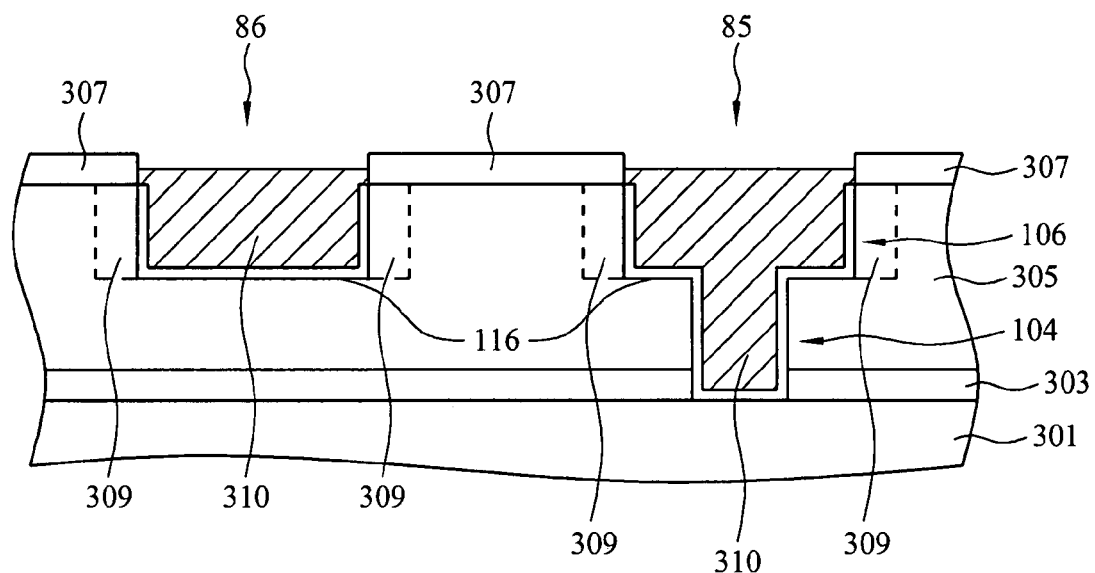
FIG. 5 is a cross sectional view of an intermediate step in an exemplary damascene process further illustrating a pre-CMP structure according to preferred embodiments.

In accordance with conventional processing and referring to FIG. 5, a barrier layer 116 is blanket deposited to line at least the dual damascene structure 85. The barrier layer 116 is preferably about 10 to 100 Angstroms thick, and it forms a barrier for Cu diffusion. The barrier layer 116 may include a metal nitride such as TaN, TiN, WN, TbN, VN, ZrN, CrN, WC, WN, WCN, NbN, AlN, and combinations thereof. In still other embodiments, the barrier layer 116 includes a Ta/TaN bi-layer structure.

The barrier layer 116 may be applied using physical vapor deposition (PVD), chemical vapor deposition (CVD), plasma enhanced chemical vapor deposition (PECVD), or plasma enhanced atomic layer deposition (PEALD). In preferred embodiments, the barrier layer 116 includes TaN, and it is deposited using atomic layer deposition (ALD).

Alternative embodiments may further include a glue layer (not shown) between the barrier layer 116 and an overlaying conductor 310. The glue layer enhances adhesion between and adjacent layers. It preferably contains materials that bond with copper and/or the underlying barrier layer. It may be about 10 to 500 Angstroms thick, preferably less than about 150 Å. It may include at least one layer consisting of Ru, Ta, Ti, W, Co, Ni, Al, Nb, AlCu alloy, nitrides thereof, and combinations thereof.

Before deposition of a conductor, a seed layer (not shown) is optionally deposited over the glue layer by, for example, PVD and/or CVD. A seed layer, preferably copper, is PVD deposited to form a continuous layer about 400 to 700 Å thick over the wafer process surface, thereby providing a continuously conductive surface for depositing the bulk of the copper during the ECD process.

Still referring to FIG. 5, following deposition of barrier layer 116, the conductor 310, preferably copper, is electroplated according to a conventional electro-chemical deposition (ECD) process to fill the trenches 86 and 106 and the via 104 including an overlying portion above the trench level (overfill). Although other copper filling methods such as PVD and CVD methods may be used, electroplating (electrodeposition) is preferred because of its superior gap-filling and step coverage. Alternative embodiments may include the conductor 310 consisting essentially of Cu, Al, Au, Ag, mixtures thereof, and alloyed compositions thereof.

Figure 6:
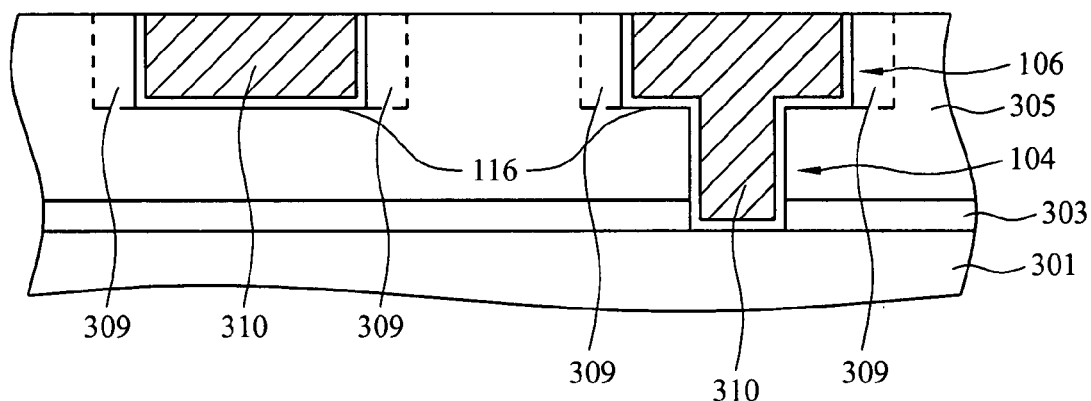
FIG. 6 is a cross sectional view of an intermediate step in an exemplary damascene process further illustrating a CMP planarized structure according to preferred embodiments.

Chemical mechanical polishing (CMP) planarizes the conductor 310 to the level shown in FIG. 6. In another alternative, electropolishing may be used in place of CMP or serially with CMP. In the alternative, a simultaneous CMP and plating process may be performed.

As shown in FIG. 6, the low-k dielectric 305 includes the carbon-adjusted region 309 adjacent the trench 106. In accordance with embodiments of the invention, the carbon-adjusted region 309 partially repairs carbon depletion damage caused by conventional trench etching. The carbon-adjusted region 309 is about 300 to 500 Å thick. It has a carbon concentration not more than about 5% less than the carbon concentration in the bulk region of the low-k dielectric 305.

The embodiments of the invention described above are exemplary and not limiting, and variations that are apparent to those skilled in the art that include the features of the invention are within the scope of the invention and the appended claims. Although embodiments of the present invention and their advantages have been described in detail, it should be understood that various changes, substitutions and alterations can be made herein without departing from the spirit and scope of the invention as defined by the appended claims.

For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor device having a low-k dielectric layer, the method comprising:
   forming a hydrocarbon layer on the low-k dielectric layer;
   forming a recessed feature in the hydrocarbon layer and in the low-k dielectric layer using a plasma etching; and
   forming a carbon layer in the recessed feature;
   diffusing carbon from the carbon layer into a low-k dielectric region adjacent the recessed feature;
   removing a carbon residue by heating the semiconductor device; and
   forming a conductor in the recessed feature.

2. The method of claim 1, wherein the recessed feature comprises an interconnect structure.

3. The method of claim 1, wherein the forming a hydrocarbon layer on the low-k dielectric layer includes a PECYD process.

4. The method of claim 3, wherein the PECYD process includes: setting a substrate temperature to between about 125 and 350° C.; setting a PECYD reactor pressure to between about 500 and 8,000 mTorr; and setting a PECYD reactor power level to between about 50 and 1500 W.

5. The method of claim 1, wherein the low-k dielectric layer comprises a material selected from the group consisting essentially of organo silicate glass (OSG), borophosphosilicate glass (BPSG), borosilicate glass (BSG), phosphosilicate glass (PSG), polyarylene ether, hydrogen silesquioxane (HSQ), methyl silsesquioxane (MSQ), polysilsequioxane, polyimide, benzocyclbbutene, amorphous polytetrafluoroethylene (PTFE), fluorinated silicate glass (FSG), porous oxides, porous nitrides, a porogen, and combinations thereof.

6. The method of claim 1, wherein the hydrocarbon layer comprises:
   between about 20 and 95 atomic percent of C;
   between about 5 and 80 atomic percent of H; and
   between about 0 and 5 atomic percent of O.

7. A semiconductor device formed by the method of claim 1, wherein the low-k dielectric layer comprises:
   a bulk dielectric region having a bulk carbon concentration; and
   a surface dielectric region adjacent the recessed feature, the surface dielectric region having a carbon concentration at least 95% the bulk carbon concentration.

8. A method for forming a semiconductor device having a low-k dielectric layer, the method comprising:
   depositing a hydrocarbon layer on the low-k dielectric layer by reacting a precursor using a PECVD process; and
   after the depositing, forming a recessed feature in the hydrocarbon layer and in the low-k dielectric layer;
   forming a carbon layer in the recessed feature;
   diffusing carbon from the carbon layer into the low-k dielectric region adjacent the recessed feature; and
   removing a carbon residue by heating the semiconductor device.

9. The method of claim 8, further including heating the semiconductor device between about 300 to 400° C.

10. The method of claim 8, wherein the precursor is a material selected from the group consisting essentially of $C_2H_4$, $(CH_3)_2CHC_6H_6CH_3$, a hydrocarbon having a carbon-carbon double bond, and combinations thereof.

11. The method of claim 8, wherein the hydrocarbon layer comprises: between about 20 and 95 atomic percent of C; between about 5 and 80 atomic percent of H; and between about 0 and 5 atomic percent O.

12. The method of claim 8, wherein the hydrocarbon layer consists essentially of: between about 20 and 95 atomic percent of C; between about 5 and 80 atomic percent of H; and between about 0 and 5 atomic percent of O.

13. The method of claim 8, wherein the low-k dielectric layer comprises a material selected from the group consisting essentially of organosilicate glass (OSG), borophosphosilicate glass (BPSG), borosilicate glass (BSG), phosphosilicate glass (PSG), polyarylene ether, hydrogen silesquioxane (HSQ), methyl silsesquioxane (MSQ), polysilsequioxane, polyimide, benzocyclbbutene, amorphous polytetrafluoroethylene (PTFE), fluorinated silicate glass (FSG), porous oxides, porous nitrides, a porogen, and combinations thereof.

14. A semiconductor device formed by the method of claim 8, wherein the low-k dielectric layer comprises:
   a bulk dielectric region having a bulk carbon concentration; and
   a trench sidewall region adjacent the recessed feature, the trench sidewall region having a carbon concentration not more than about 5% less than the bulk carbon concentration.

15. A method for repairing damage to a low-k dielectric layer caused by a semiconductor device manufacturing process, the method comprising:
   forming a hydrocarbon layer on the low-k dielectric layer;
   etching the hydrocarbon layer and the low-k dielectric layer using a plasma process; and
   removing a carbon residue by heating the low-k dielectric layer to at least about 300° C.

16. A method of claim 15, wherein the hydrocarbon layer comprises:
   between about 20 and 95 atomic percent of C;
   between about 5 and 80 atomic percent of H; and
   between about 0 and 5 atomic percent of O.

17. The method of claim 15, wherein the forming a hydrocarbon layer further comprises reacting a material selected from the group consisting essentially of $C_2H_4$, $(CH_3)_2CHC_6H_6CH_3$, a hydrocarbon having a carbon-carbon double bond, and combinations thereof.

18. The method of claim 15, wherein the low-k dielectric layer comprises a material selected from the group consisting essentially of organo silicate glass (OSG), borophosphosilicate glass (BPSG), borosilicate glass (BSG), phosphosilicate glass (PSG), polyarylene ether, hydrogen silesquioxane (HSQ), methyl silsesquioxane (MSQ), polysilsequioxane, polyimide, benzocyclbbutene, amorphous polytetrafluoroethylene (PTFE), fluorinated silicate glass (FSG), porous oxides, porous nitrides, a porogen, and combinations thereof.

* * * * *

UNITED STATES PATENT AND TRADEMARK OFFICE
CERTIFICATE OF CORRECTION

PATENT NO. : 7,365,026 B2  Page 1 of 2
APPLICATION NO. : 11/048215
DATED : April 29, 2008
INVENTOR(S) : Jeng et al.

It is certified that error appears in the above-identified patent and that said Letters Patent is hereby corrected as shown below:

On the Title Page, Item (57) ABSTRACT, line 11, before carbon-adjusted insert --a--.
In Col. 1, line 7, delete "related" and insert --relates--.
In Col. 1, line 66, after needed insert --to--.
In Col. 5, line 14, delete "x" and insert --x--.
In Col. 5, line 15, delete "x" and insert --x--.
In Col. 5, line 30, after 95% insert --of--.
In Col. 5, line 40, after roughening insert --of--.
In Col. 5, line 66, delete "silesquioxane" and insert --silsesquioxane--.
In Col. 5, line 67, delete "polysilsequioxane" and insert --polysilsesquioxane--.
In Col. 5, line 67, delete "benzocyclbbutene" and insert --benzocyclobutene--.
In Col. 8, line 7, delete "PECYD" and insert --PECVD--.
In Col. 8, line 9, delete "PECYD" and insert --PECVD--.
In Col. 8, line 11, delete "PECYD" and insert --PECVD--.
In Col. 8, line 12, delete "PECYD" and insert --PECVD--.
In Col. 8, line 19, delete "silesquioxane" and insert --silsesquioxane--.
In Col. 8, lines 19-20, delete "polysilsequioxane" and insert --polysilsesquioxane--.
In Col. 8, line 20, delete "benzocyclbbutene" and insert --benzocyclobutene--.
In Col. 8, line 35, after 95% insert --of--.
In Col. 8, line 42, delete "laver" and insert --layer--.
In Col. 8, line 55, insert new paragraph return before --between about 20 and 95 atomic percent of C;--.
In Col. 8, line 56, insert new paragraph return before --between about 5 and 80 atomic percent of H;--.
In Col. 8, lines 56-57, insert new paragraph return before --between about 0 and 5 atomic percent O.--.
In Col. 8, line 57, after percent insert --of--.
In Col. 8, line 59, insert new paragraph return before --between about 20 and 95 atomic percent of C;--.
In Col. 8, line 60, insert new paragraph return before --between about 5 and 80 atomic percent of H;--.
In Col. 8, line 61, insert new paragraph return before --between about 0 and 5 atomic percent of O.--.
In Col. 8, line 67, delete "silesquioxane" and insert --silsesquioxane--.
In Col. 8, line 67-Col. 9, line 1, delete "polysilsequioxane" and insert --polysilsesquioxane--.
In Col. 9, line 1, delete "benzocyclbbutene" and insert --benzocyclobutene--.

UNITED STATES PATENT AND TRADEMARK OFFICE
CERTIFICATE OF CORRECTION

PATENT NO. : 7,365,026 B2
APPLICATION NO. : 11/048215
DATED : April 29, 2008
INVENTOR(S) : Jeng et al.

It is certified that error appears in the above-identified patent and that said Letters Patent is hereby corrected as shown below:

In Col. 10, line 15, delete "silesquioxane" and insert --silsesquioxane--.
In Col. 10, lines 15-16, delete "polysilsequioxane" and insert --polysilsesquioxane--.
In Col. 10, line 16, delete "benzocyclbbutene" and insert --benzocyclobutene--.

Signed and Sealed this

Eighth Day of July, 2008

JON W. DUDAS
*Director of the United States Patent and Trademark Office*